(12) United States Patent
Bussmann et al.

(10) Patent No.: US 6,888,660 B2
(45) Date of Patent: May 3, 2005

(54) MAGNETIC ORGANIC LIGHT EMITTING DEVICE AND METHOD FOR MODULATING ELECTROLUMINESCENCE INTENSITY

(75) Inventors: Konrad Bussmann, Springfield, VA (US); Albert H. Davis, Annandale, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/394,187

(22) Filed: Mar. 24, 2003

(65) Prior Publication Data

US 2004/0190105 A1 Sep. 30, 2004

(51) Int. Cl.[7] ............................................. G09K 11/06
(52) U.S. Cl. ........................................ 359/248; 257/98
(58) Field of Search ........................... 359/248; 257/40, 257/98, 14, 22

(56) References Cited

U.S. PATENT DOCUMENTS

| | | | |
|---|---|---|---|
| 5,874,749 A | * | 2/1999 | Jonker .......................... 257/98 |
| 6,325,914 B1 | | 12/2001 | Dediu et al. |
| 2002/0051893 A1 | * | 5/2002 | Gao et al. .................... 428/690 |
| 2002/0093006 A1 | * | 7/2002 | Vardeny et al. ........ 252/301.16 |
| 2003/0001154 A1 | * | 1/2003 | Epstien et al. ................. 257/40 |
| 2003/0022020 A1 | * | 1/2003 | Epstein et al. .............. 428/690 |

* cited by examiner

Primary Examiner—Scott J. Sugarman
Assistant Examiner—Richard Hanig
(74) Attorney, Agent, or Firm—John J. Karasek; George A. Kap (57) ABSTRACT

This invention pertains to a spintronic device for emitting light and to a method for its operation. The device includes a cathode electrode capable of producing spin-polarized charge carrier electrons under the influence of an electric field; an anode electrode spaced from the cathode for producing spin-polarized charge carrier holes; an intermediate medium disposed between the electrodes into which the carriers are injected under the influence of an electric field and which serves as a transport medium for the carriers wherein the carriers are transported and within which the carriers react and form excitons; and a circuit between the electrodes for imparting en electric field which serves as the motive force for the carriers. The method includes the steps of producing spin-polarized electrons, producing spin-polarized holes, passing the electrons and the holes through a transport medium under influence of an electric field whereby the electrons and the holes, being oppositely charged, combine to produce excitons which produce light, and collecting the light so produced.

25 Claims, 7 Drawing Sheets

MAGNETIC ORGANIC LIGHT EMITTING DEVICE AND METHOD FOR MODULATING ELECTROLUMINESCENCE INTENSITY

BACKGROUND OF THE INVENTION

This invention pertains to a spintronic light emitting device and to a method for operating such a device.

DESCRIPTION OF BACKGROUND AND RELATED ART

Organic light emitting diode devices produce light by the recombination of electron and hole charge carriers within an organic semiconductor material. Electrons injected from a cathode and holes injected from an anode propagate within the semuconductor to form bound electron-hole pairs called excitons. Electrons and holes carry negative and positive electric charges, respectively. Electrons propagate via conduction or excited molecular states whereas holes propagate through valence or ground molecular states. Electrons are typically injected from a low work function material, such as a material with a work function of about 3.5 eV or less, and holes are typically injected from a high work function material, such as a material with a work function of greater than about 5.5 eV. Optical photons are generated having energy of about 1.5 eV by relaxation of electrons to hole states.

Each of the electron and hole carriers also has an associated spin degree of freedom that may be resolved along any chosen direction. The spin for each carrier is a discrete, two-valued parameter identified as either "up" ($|+\rangle$) or "down" ($|-\rangle$) direction, also written as $|\uparrow\rangle$ or $|\downarrow\rangle$, respectively. The exciton formed from an electron-hole pair can have one of four spin states, namely one singlet and three triplets ($T_-$, $T_0$, $T_+$) shown below:

$S = 1/\sqrt{2}(|+-\rangle - |-+\rangle)$ $T_- = |--\rangle$ $T_O = 1/\sqrt{2}(|+-\rangle + |-+\rangle)$ $T_+ = |++\rangle$.

The quantum mechanical selection rules allowing the recombination of the electron-hole pairs for low atomic mass constituent materials in organic light emitting structures restrict the spin singlet state to be the electron-hole configuration that will generate light. The triplet configurations generally recombine without emission of light.

Related prior art includes Dediu U.S. Pat. No. 6,325,914 entitled "Method And Device For Transferring Spin-Polarized Charge Carriers" wherein the method includes the steps of injecting unipolar charge carriers into an organic material and transporting them through the organic material; and the device includes a medium suitable for transporting charge carriers and apparatus for injecting the carriers into the medium. Please note that this device is unipolar and does not produce light. Unipolar conduction involves transport of only electrons of holes but not both.

OBJECTS AND BRIEF DESCRIPTION OF THE INVENTION

An object of this invention is a light emitting device characterized by a cathode and an anode capable of producing spin-polarized charge carriers, i.e., electrons and holes, and an intermediate medium between the electrodes capable of transporting the charge carriers under the influence of an electric field where the charges combine to form excitons, only some of which produce light.

Another object of this invention is doubling of the quantum efficiency from 25% up to 50%, which is directly proportional to the quantity of light.

Another object of this invention is modulation of light produced by the spintronic light-emitting device of this invention with an intermediate medium disposed between a spaced cathode and an anode by manipulating the polarization of the injected carriers by any means, but especially with a magnetic field, temperature or application of circularly polarized light.

Another object of this invention is spaced ferromagnetic electrodes with Curie temperature above the operating temperature, particularly above room temperature to provide for room temperature operation.

Another object of this invention is modulation of light produced by the device of this invention by means of a magnetic field affecting at least one of its electrodes.

These and other objects of this invention can be achieved by a light emitting device characterized by a pair of spaced electrodes capable of injecting spin-polarized charge carriers, under the influence of an electric field, into an intermediate medium disposed between the electrodes whereby the light emitted by the device is modulated by subjecting the electrodes to a magnetic field to alter spin-polarization of the charge carriers. The method of operating the device includes the steps of producing spin-polarized electrons, producing spin-polarized holes, passing the electrons and the holes through a transport medium under influence of an electric field whereby the electrons and the holes, being oppositely charged, combine to produce excitons which produce light, and collecting the light so produced.

DETAILED DESCRIPTION OF THE INVENTION

This invention pertains to a spintronic light emitting device and to a method for operating such a device.

The device includes a pair of spaced electrodes that can produce spin-polarized charge carriers under the influence of an electric field separated by an intermediate medium which serves as a transport medium for the charge carriers which, being of opposite charge, combine to form singlet and triplet excitons. Of all the excitons produced, about ¼ are singlets, which typically produce light, and about ¾ of all excitons produced are triplets, which typically do not produce light. It is possible to change the ratio of singlets to triplets by the device of this invention, as should be apparent from equation (1) and (2), below. Although, generally speaking, all singlets can produce light and all triplets do not, it is possible to produce singlets that do not produce light and triplets that do. The additional light that the device of this invention can produce, compared to a prior art device, results from using spin-polarized charge carriers, as will become apparent later on.

Figure 1:
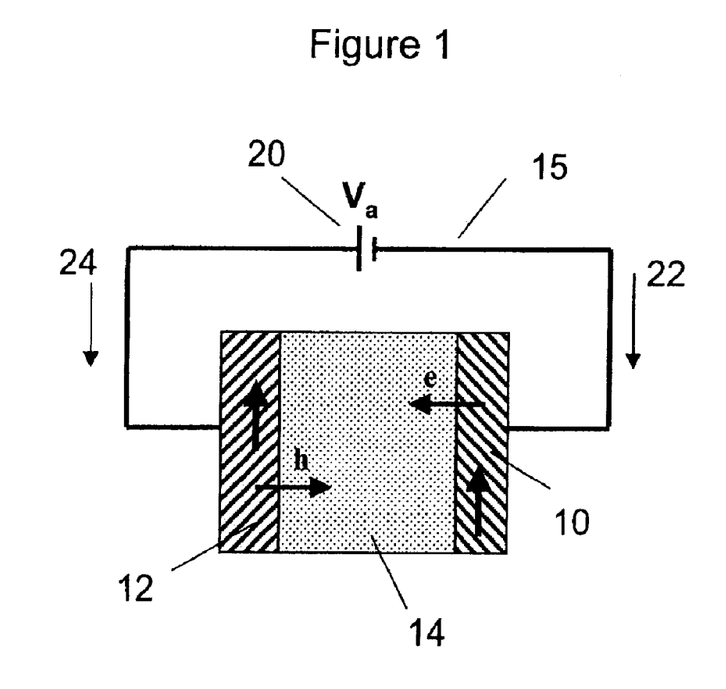
FIG. 1 is a schematic illustration in cross-section of a spintronic light emitting device characterized by electrodes capable of producing spin-polarized charge carriers.
Figure 2:
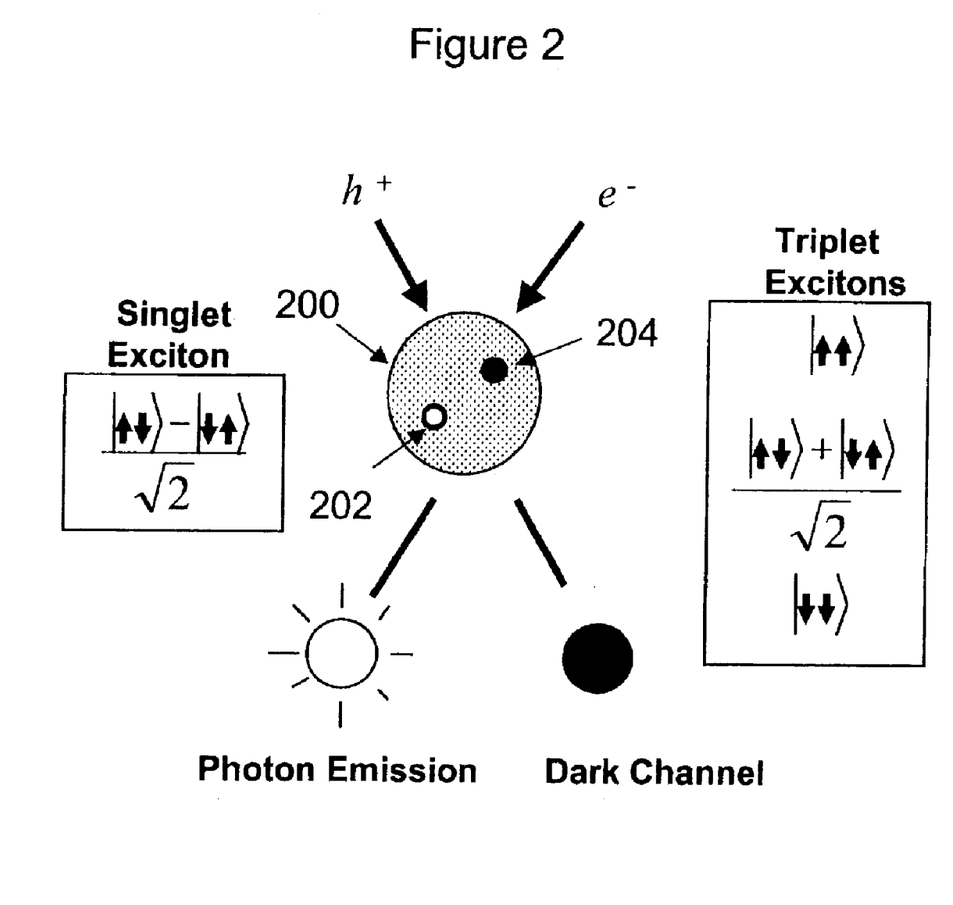
FIG. 2 illustrates the excitonic process leading to electroluminescence or light production when a singlet excitation emits a photon.

FIG. 1 is a schematic illustration of the novel spintronic device which can produce light. The device illustrated in FIG. 1 includes a pair of electrically conducting spaced electrodes 10,12 with a semiconducting medium 14 therebetween which facilitates movement of charge carriers under the influence of an electric field. The electric field is imposed between the electrodes by circuit 15 which contacts cathode 10 and anode 12. The electrodes are typically ferromagnetic and produce spin-polarized charge carriers, i.e., negatively charged spin-polarized electrons produced by the cathode and positively charged spin-polarized holes produced by the anode. The arrows 16,18 within the electrodes, both of which point up, indicate polarization direction of the spin-polarized electrons and holes. From the source of electric energy 20, also identified as "Va", electrons travel in the clockwise direction, indicated by arrow 22 from the electric energy source 20 along circuit 15, whereas holes travel in the counterclockwise direction, indicated by arrow 24 along circuit 15. The electrons from the cathode and the holes from the anode become spin-polarized after passing through the electrodes and enter medium 14 where they combine, being of opposite charge, to form excitons. Singlet excitons give off light by shedding a photon on decay, triplet excitons do not give off light because they do not shed a photon on decay. FIG. 2 illustrates formation of exciton 200 from combination of a spin-oriented hole ($h^+$) 202 and a spin-oriented electron (e–) 204. Whereas, for non-spin polarized carriers, singlet and triplet excitons form in the ratio of 1:3, respectively, with polarized carriers, the ratio can be changed anywhere in the range of 0:1–1:1. The singlet and the triplet excitons are identified in quantum mechanical ket notation in FIG. 2. For materials used in this work, operating at room temperature, lifetime of each singlet is approximately 20 ns following which it decays while emitting a photon and lifetime of each triplet is approximately 25 $\mu$s. Lifetimes are dependent on the type of intermediate medium used. The figures given here are for a generic embodiment of the device.

Typically, the anode and the cathode are each made from a ferromagnetic material that have intrinsic magnetization and spin-polarization that allow their use as sources for spin-polarized electrons and holes. Common anode materials are iron, cobalt, nickel, chromium dioxide ($CrO_2$), strontium ruthinium oxide ($SrRuO_3$), lanthanum calcium manganate ($LaCaMnO_4$) and other high work function ($\phi$) materials having work function in the approximate range of 4–6 eV. The work function indicates minimum energy needed to remove an electron from the material to free space. Preferred anode materials include iron ($\phi$=4.5 eV), cobalt ($\phi$=5.0 eV), and nickel ($\phi$=5.15 eV). Common cathode materials have work function in the range of 2–3.8 eV and include gadolinium ($\phi$=3.1 eV), dysprosium ($\phi$=3.1 eV) and other low work function materials. Gadolinium has Curie temperature of 293 K and becomes non-magnetic above 293 K, which is near room temperature.

Although the electrodes should be ferromagnetic, they need not be, as illustrated, for example, by gallium arsenide (GaAs). Gallium arsenide can serve as a cathode if it is subjected to light that is circularly polarized so that it can produce spin-polarized electrons under the influence of an electric field.

Different materials can be used for anodes and/or cathodes for various reasons. Such reasons include chemical stability, magnetic properties, work function matching, and the like.

Thickness of electrodes is determined by parameters such as conductivity, transparency, etc. It is preferred that at least one electrode be transparent or semi-transparent so light can exit from the intermediate medium. Typical thickness for the anode is 1–50 nm to allow light transmission. Typical cathode thickness is 20–200 nm to maintain chemical integrity. If an electrode is too thin and cannot sustain the needed physical integrity, it can be mounted on a transparent or a non-transparent substrate.

The anode and the cathode can also utilize barrier layers between the metal electrodes and the intermediate semiconductor medium to modulate the carrier energy. This may be possible by the use of tunnel junction barriers or by thin layers of other materials, not necessarily ferromagnetic, that facilitate work function matching to within about 0.2 eV. Use of barriers, which act as energy filters, may allow the use of chemically stable cathode materials. The barriers can be used on anodes and/or cathodes and can enhance lifetime and reliability of electrodes and devices.

The intermediate medium 14 in FIG. 1 can be organic or inorganic but is typically an organic layer composed minimally of an electroluminescent, organic emitter material. Typical thickness of the intermediate medium is also subject to various parameters, including spin relaxation time and electron mobility ($\mu_e$) and hole mobility ($\mu_h$). The spin relaxation time for both electrons and holes must be greater than the time required for these carriers to propagate from the source to where the excitons are formed. This is carrier propagation time. Operation of this device requires the formation of excitons from spin-polarized carriers before loss of spin polarization. The propagation time is inversely proportional to the mobility of the carriers such that high mobility carriers will require less time to travel from the source electrode to the recombination zone. The propagation time is directly proportional to the thickness of the intermediate medium. Ideal materials for the intermediate medium have high carrier mobilities ($\mu_e$, $\mu_h$ greater than about $10^{-5}$ $cm^2$/V-s). When the spin-polarized holes and electrons are injected into the intermediate medium, the spin-polarized holes and electrons form excitons within the medium, the exact location within the medium where the excitons are formed depends on parameters of the device, such as material and thickness of the electrodes, material and thickness of the medium, impressed voltage which provides the electric field, temperature of operation, etc. Upon formation of the excitons, decay of singlets emits photons which propagate in all directions. If the device is disposed on a transparent substrate, light can be collected from the photons passing through the substrate or in any other manner.

In a preferred embodiment, the intermediate medium is organic and includes an electron transport layer adjacent to and in contact with the cathode and a hole transport layer adjacent to and in contact with the anode. An example of an especially suitable electron transport layer is tris (8-hydroxyquinoline) aluminum (Alq3) and an example of an especially suitable hole transport layer is N,N'-(bis (1-naphthyl)-N,N'-diphenyl-1,1'-biphenyl-4,4'-diamine (NPB) which materials are selected for many reasons, including spin relaxation time, which is estimated to be about 1 microsecond, and mobility under an electric field. Although mobility of spin-polarized electrons in Alq3 is slower than mobility of holes in NPB, thickness of each transport layer is on the order of 75 nm. Making Alq3 and NPB layers much thicker would lead to spin-depolarization and high operating voltages. Alternative intermediate materials include MEH-PPV and other polymeric materials.

Design of a spintronic device is also accompanied by consideration of work function matching to facilitate introduction of the spin-polarized charge carriers into the intermediate medium. Electron charge carriers propagate in the lowest unoccupied molecular orbital (LUMO) and hole charge carriers propagate in the highest occupied molecular orbital (HOMO). Matching of work function energy of a cathode to the LUMO of an electron transport layer (ETL) on one hand and an anode to the HOMO of the hole transport layer (HTL) on the other, should be done to where the difference is less than about 0.2 eV. This is the case for gadolinium cathode and Alq3 electron transport layer where the work function of gadolinium is 3.1 eV and matches the LUMO of 3.1 eV in Alq3. At the other end of the device, cobalt anode has work function of 5.0 eV and HOMO level work function in NPB is 5.2 eV. The LUMO levels of NPB and the HOMO levels of Alq3 do not participate in the transport of the carriers in this device.

Figure 3:
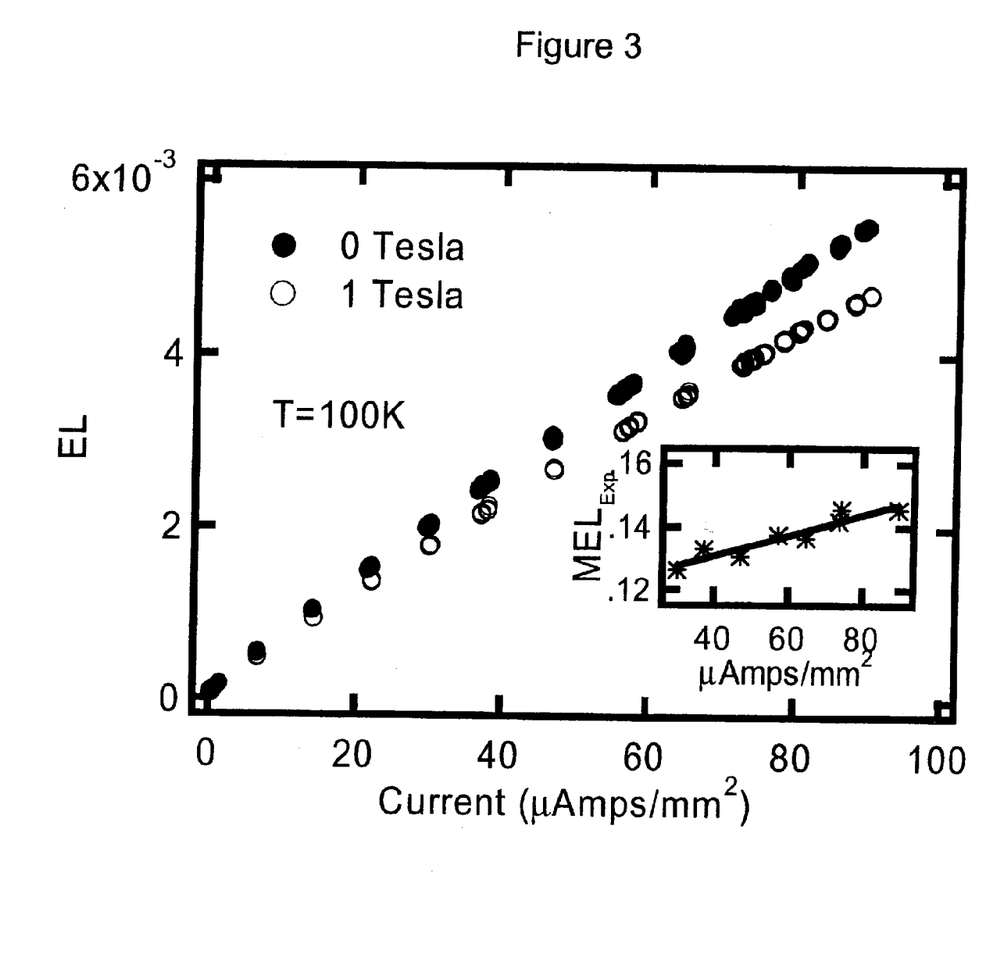
FIG. 3 is a graph showing electroluminescence of a magnetic organic light emitting device maintained at about room temperature with current varying from 0 to $16 \times 10^{-6}$ amps per $mm^2$ at zero and high (1 Tesla) magnetic field.
Figure 4:
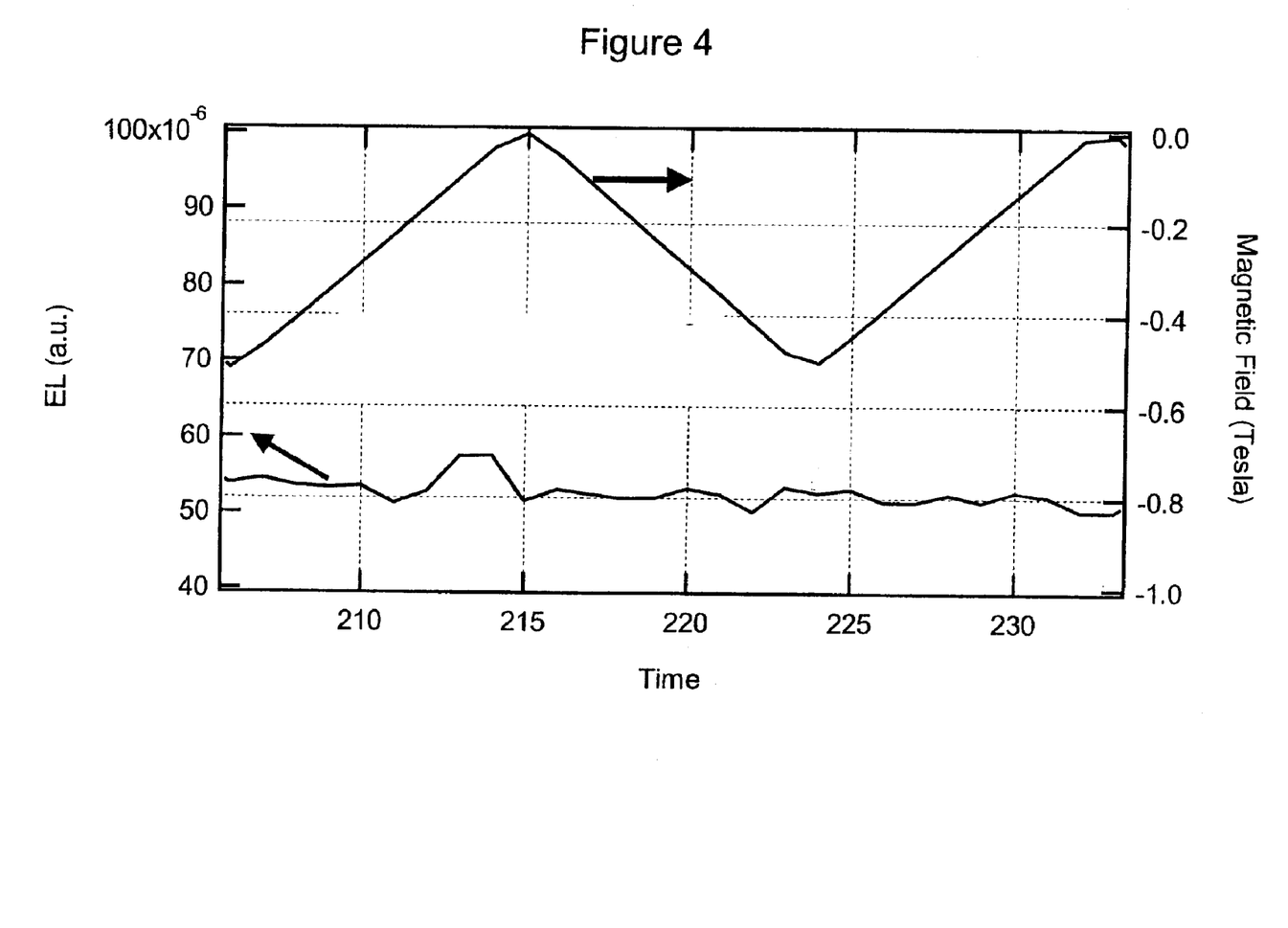
FIG. 4 is a graph showing approximately a constant electroluminescence at magnetic field varying over the approximate range of 0–0.5 Tesla over the time period of 205–235 minutes with the device at 293 K.
Figure 6:
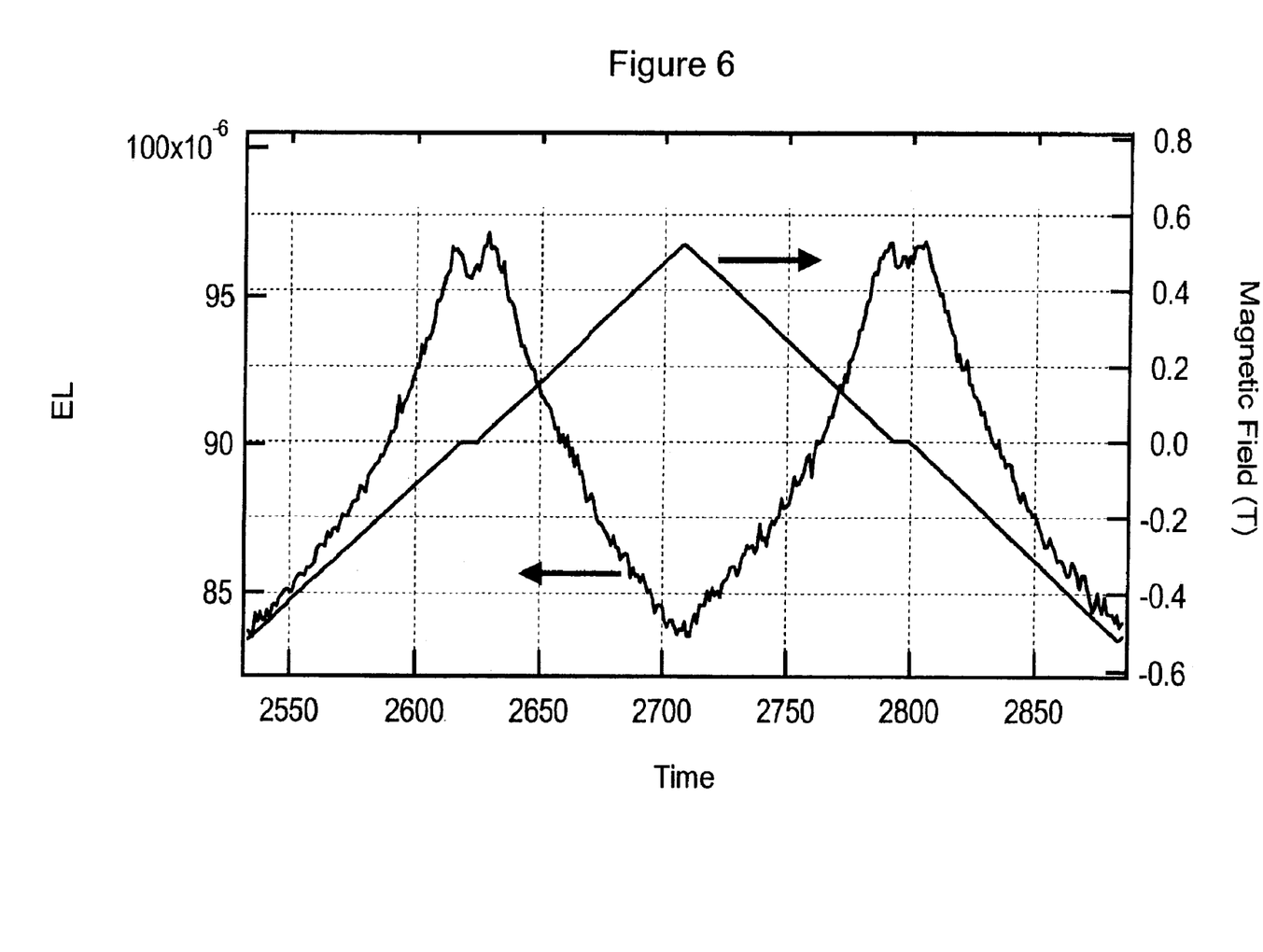
FIG. 6 shows a graph of electroluminescence varying over the range of $84 \times 10^{-6}$ to $97 \times 10^{-6}$ a.u. with variation in magnetic field of from $-0.5$ to $+0.5$ Tesla.

Impressed voltage 20 in FIG. 1 can vary between 1V to 30V, but is typically about 20V. Turn on voltage for preferred embodiment of the device of this invention is about 18V. Although impressed voltage can range from 1–30 volts, it is the current that is directly proportional to electroluminescence, as is evident from FIG. 3 which is a graph of electroluminescence (EL) in arbitrary units (a.u.) of light intensity versus current density in amperes per square millimeter $(A/mm^2) \times 10^{-6}$. The relationship shown in FIG. 3 is for a spintronic device at 290 K with cobalt anode, gadolinium cathode, Alq3, electron transport layer and NPB hole transport layer. FIG. 4 is a graph showing the relationship of electroluminescence (EL) with magnetic field varying from −0.5 to 0 Tesla with time period varying from 205 to 235 minutes for the device described directly above and in Ex. 1 at 290 K. FIG. 4 shows that whereas the magnetic field was varied from −0.5 to 0 Tesla, electroluminescence or light output of the device remained about constant at about $55 \times 10^{-6}$ a.u. The same device was tested similarly as described in connection with FIG. 4 except at 30K and showed variation in electroluminescence from a minimum of $84 \times 10^{-6}$ a.u. to a maximum of $97 \times 10^{-6}$ a.u. as magnetic field was varied from −0.5 to +0.5 Tesla over the indicated period of time, as in FIG. 6.

In order to modulate light from a light emitting device of this invention, which is based on the use of a pair of spaced electrodes which can produce spin-polarized electrons and holes under the influence of an electric field, such a device is subjected to a magnetic field which can affect and change orientation of the spin-polarized electrons and holes and by changing orientation of the spin-polarized electrons relative to the spin-polarized holes, the number of singlets can be changed relative to the number of triplets and thus change or modulate light output of such a device from weak to strong, or vice versa or anything in between.

The concept of modulating light produced by a spintronic device under influence of a magnetic field is based on the fact that the spin-polarized electrons and holes produced by such a device can have various relative orientations ranging from parallel to antiparallel.

Figure 5:
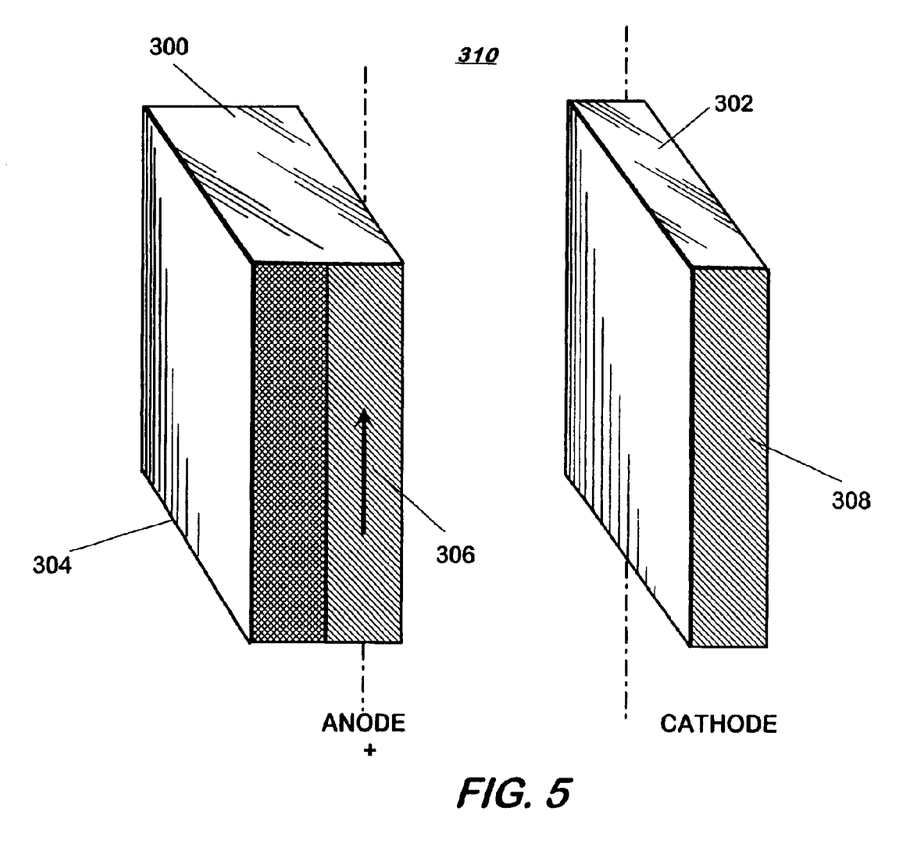
FIG. 5 is a schematic illustration of a pair of spaced magnetized electrodes with an optional anti-ferromagnetic layer demonstrating independent re-orientation cathode magnetization relative to that of the anode by θ degrees.

To facilitate independent alignment of spin-polarized electrons and holes, an anti-ferromagnetic layer can be used on one of the electrodes. Examples of anti-ferromagnetic materials include nickel oxide and iron manganese alloys. The anti-ferromagnetic material that is typically used with an anode is iron manganese, iridium manganese, platinum manganese and are typically greater than 300 Å thick. Typically, however, the anti-ferromagnetic layer can be used on either side on the side opposite the side that is in contact with the intermediate medium. FIG. 5 illustrates spaced disposition of anode 300 and cathode 302, pursuant to this invention, having an anti-ferromagnetic layer 304 disposed on the surface of anode 300. Spin-polarization orientation of the holes produced by the anode is shown as vertical at 306 and spin-polarization orientation of the electrons produced by the cathode is shown at 308, which is θ degrees off-set from the vertical orientation of the spin-polarized holes. The off-set being a result of the anti-ferromagnetic layer 304 and application of an external magnetic field $H_{ext}$ 310.

It is possible to determine the fraction of singlets and triplets produced by the device in absence or presence of a magnetic field where disposition of the spin-polarized electrons and holes is θ degrees, where θ is in the range of 0–180°.

The equation (1), below, can be used to determine fraction of singlets formed:

$$w_s = \tfrac{1}{4}[1 - P_e P_h \cos \theta] \tag{1}$$

whereas fraction the triplets formed is given by the following equation (2), below:

$$w_t = \tfrac{1}{4}[3 + P_e P_h \cos \theta] \tag{2}$$

where $w_s$ and $w_t$ represent fractions of singlets (s) and triplets (t) formed, respectively; $P_e$ is polarization of the spin-polarization electrons (e); $P_h$ is polarization of the spin-polarized holes (h); and θ is the angle in degrees between disposition of the spin-polarized electrons and holes. The quantity $P_e P_h$ can be readily obtained for any system whereas it is more difficult to obtain individual quantities. It is estimated that a spintronic device of this invention can double the light output compared to a prior art device that is not based on spintronics. Polarization (P) is given by the common definition: by the formula (3):

$$P = (N\uparrow - N\downarrow)/(N\uparrow + N\downarrow) \tag{3}$$

Looking at equations (1) and (2) for determining fraction of singlets ($w_s$) and triplets ($w_t$), it should be apparent that in absence of polarization effect, contribution of the quantity $P_e P_h$ in the equations would be nil as it would be at θ of 90° since cosine of 90° is zero. Contribution of that portion of the equations would also be nil if the electrodes did not produce polarized charge carriers where either $P_e$ or $P_h$ were zero. It should also be apparent that the sign within the brackets of the equations is very important since cos θ can be positive or negative since cos of 0° is +1 whereas cos of 180° is −1. Needless to say, above equations (1) and (2) are important since they allow one to set the ratio of singlets to triplets and thus control quantity of light output. The ratio can be readily obtained by dividing $w_s$ by $w_t$. Assuming $P_e$ of 0.4 and $P_h$ of 0.5, the ratio of $w_s/w_t$ for angle θ of 0° is 0.21, for angle θ of 180° the ratio is 0.82, and for angle θ of 90° the ratio is 0.33. So, using the invention described herein, the optimum light output for the device is for angle θ of 180°, on the basis of assumptions made and the angles investigated.

The method of operating the device pertains to operation of a spintronic device which is an electronic device that uses spin generated by magnetism to cause an effect. The steps of the method include producing spin-polarized electrons, producing spin-polarized holes, passing the electrons and the holes through a transport medium under influence of an electric field whereby the electrons and the holes, being of opposite charge, combine to produce excitons which produce light, and collecting the light so produced.

Since the light output of the devices of this invention are sensitive to applied magnetic field, the devices can be used as magnetic sensors. Also, the devices can be arranged in arrays and used to display information or images. The devices can be used as non-volatile memory elements that can be written with a magnetic field and read by observing the level of light they put out, with: low intensity being "zero" and high intensity being "one," for instance. Securing power of these devices would leave them in the magnetic state they were in at the time they were last written and reapplying power would allow read out of the stored information. The devices can be used as magneto-optical transducers and as signal devices that turn a magnetic signal into an amplitude modulated light signal. The devices can also be used as a multi-state devices being able to assume one of several states. This would be accomplished by building the magnetic electrodes in such a way that one or both of them have more than two stable orientations. Thus, stable combinations intermediate to fully anti-parallel could be attained and maintained.

Having described the invention, the following example is given as a particular embodiment thereof. It is understood that the example is given by way of illustration and is not intended to limit the specification of the claims in any manner.

EXAMPLE

This example demonstrates a working device of this invention capable of being operated at room temperature.

Figure 7:
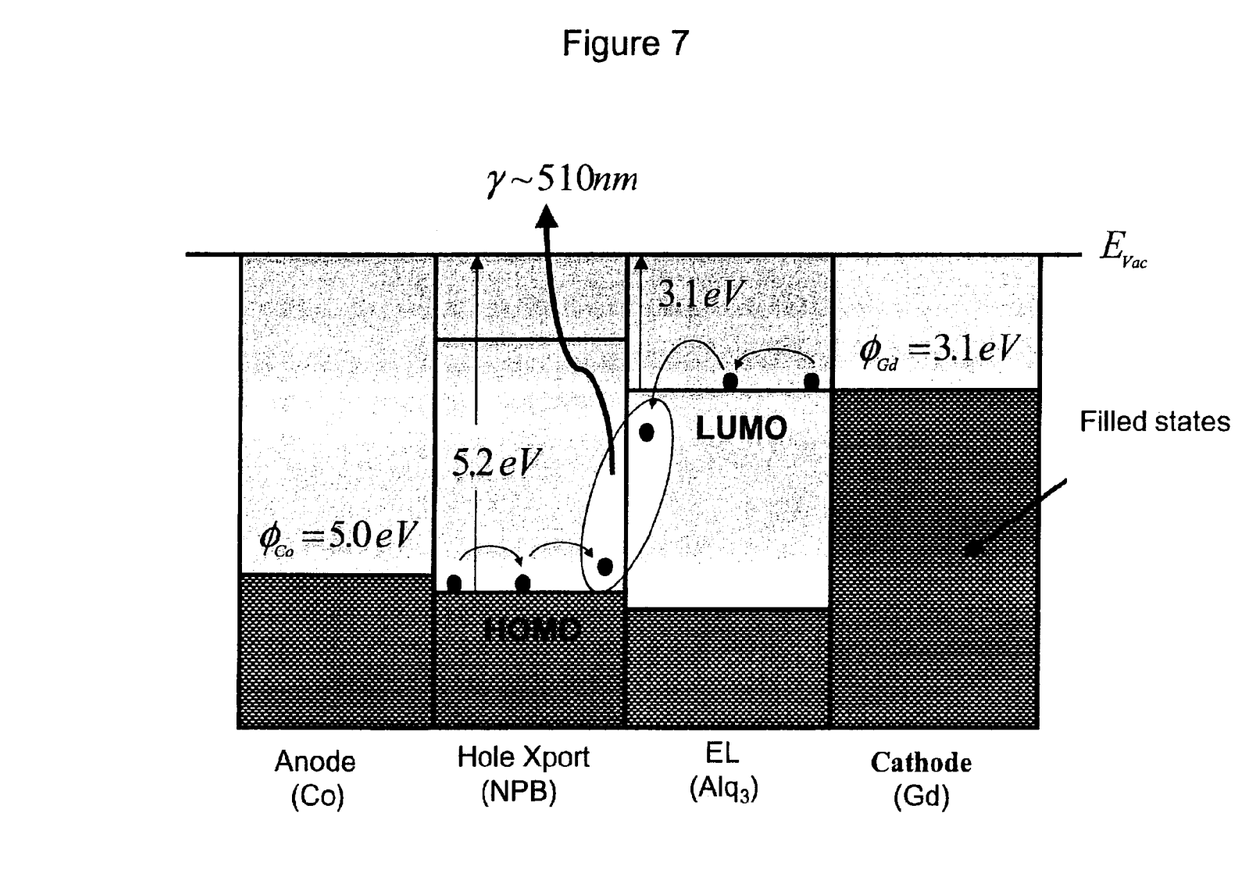
FIG. 7 is an energy level diagram for the example showing work function matching with the LUMO level at the cathode and work function matching with the HOMO level at the anode.

Structure of the device is schematically illustrated by FIG. 1 where the device had planar dimensions of 1 square millimeter with an impressed alternating voltage in the circuit of 20 volts RMS. The anode was cobalt 15 nanometers (nm) thick and the cathode was gadolinium 30 nm thick. Curie temperature ($T_c$) of gadolinium is 293 K and $T_c$ of cobalt is 1403 K. At impressed voltage of 20 volts RMS, current density of 1 $\mu a/mm^2$ flowed into the cathode and current density of 1 $\mu a/mm^2$ flowed into the anode. The intermediate medium was 75 nm thick organic layer N,N'-(bis(1-naphthyl)-N,N'-diphenyl-1,1'-biphenyl-4,4'-diamine (NPB) in contact with the anode and a 75 nm thick layer of tris(8-hydroxyquinoline)aluminum (Alq3) in contact with the cathode. NPB and Alq3 formed an interface at which the electrons and the holes combined to form the excitons. Total thickness of the intermediate medium was 150 nm. At 15 nm thickness, the cobalt anode had a 20% transparency and the gadolinium cathode is 30 nm thick. Transparency of the cathode is not important since light was collected through the anode. Mobility of the spin-polarized electrons in the Alq3 transport layer is estimated to be $10^{-5}$ $cm^2$/V-sec and mobility of the spin-polarized holes is estimated to be $10^{-3}$ $cm^2$/V-sec The spin relaxation time of the spin-polarized electrons in Alq3 and holes in NPB is undetermined but is believed to be about 1 $\mu s$. Light output of the device was FIG. 7 illustrates work function matching for this device. The work function numbers given in FIG. 7 are negative numbers with the vacuum layer at the top. Work function of the cobalt anode is 5.0 eV whereas the HOMO level of NPB hole transport layer is 5.2 eV. At the cathode, the cathode was gadolinium with a work function level of 3.1 eV and the LUMO level of Alq3 electron transport layer is also 3.1 eV.

While presently preferred embodiments have been shown of the novel light emitting device and a way to operate it, persons skilled in this art will readily appreciate that various additional changes and modifications can be made without departing from the spirit of the invention as defined and differentiated by the following claims.

What is claimed:

1. A spintronic device for producing light by manipulating the polarization of injected carries in order to increase the quantum efficiency up to 50%: comprising a cathode capable of forming spin-polarized electrons under influence of an electric field; an anode spaced from said cathode capable of forming spin-polarized holes under influence of an electric field; an intermediate medium between said cathode and said anode for serving as a transport medium for the electrons and the holes wherein the electrons and holes, due to their opposite charges, combine to form excitons, some of which produce light; and a circuit between said cathode and said anode for providing motive force for injecting the electrons and the holes into said medium wherein the excitons are formed.

2. The device of claim 1 wherein said cathode and said anode are made from a material that can produce spin-polarized electrons and holes.

3. The device of claim 1 wherein said cathode and said anode are ferromagnetic and said medium is organic.

4. The device of claim 3 wherein said medium includes an electron transport layer in association with said cathode and a hole transport layer in association with said anode.

5. The device of claim 1 wherein said anode has work function in the range of 4–6 eV; said cathode has work function in the range of 2–3.8 eV; said medium includes an electron transport layer in association with said cathode having lowest unoccupied molecular orbital within about 0.2 eV of the work function of said cathode and a hole transport layer in association with said anode having highest occupied molecular orbital within about 0.2 eV of the work function of said anode.

6. The device of claim 5 including a buffer layer for facilitating injection of the electrons and/or holes into said medium.

7. The device of claim 5 including means for subjecting said device to a magnetic field.

8. The device of claim 5 wherein said cathode is gadolinium, said anode is cobalt, said electron transport layer is tris (8-hydroxyquinoline) aluminum in contact with said cathode and said hole transport layer is N,N'-(bis(1-naphthyl)-N,N'-diphenyl-1,1'-biphenyl-4,4'-diamine in contact with said anode.

9. The device of claim 8 wherein said cathode is about 30 nm thick, said anode is about 15 mn thick, said electron transport layer is about 75 nm thick, and said hole transport layer is about 75 nm thick.

10. The device of claim 1 including an anti-ferromagnetic layer in association with said cathode and/or said anode and an external magnetic field.

11. The device of claim 1 including an anti-ferromagnetic layer on said anode and an external magnetic field.

12. A method for producing light with a light emitting device by manipulating the polarization of injected carries in order to increase the quantum efficiency up to 50%: comprising the steps of (a) producing spin-polarized electrons, (b) producing spin-polarized holes, (c) passing the electrons and the holes through a transport medium under influence of an electric field whereby the electrons and the holes, being oppositely charged, combine to produce excitons which produce light, and (d) collecting the light so produced.

13. The method of claim 12 wherein said step of producing the electrons includes the step of passing electric energy into a cathode which can produce the spin-polarized electrons and the step of producing the holes includes the step of passing electric energy into an anode which can produce spin-polarized holes.

14. The method of claim 13 wherein the electric energy is generated by a voltage of 1–30 volts applied to the cathode and the anode.

15. The method of claim 14 wherein the anode and the cathode are ferromagnetic and curie temperature thereof is above about 300 K.

16. The method of claim 15 including the step of passing the spin-polarized electrons through an electron transport layer and passing the spin-polarized holes through a hole transport layer whereby the electrons and the holes combine to form excitons at the interface of the transport layers.

17. The method of claim 16 including the step of passing the electrons and/or the holes through a buffer to facilitate injection and transport to the intermediate media.

18. The method of claim 16 including the step of applying an antiferromagnetic layer to the outside surface of one of the electrodes to facilitate independent control of magnetization orientation relative to that of the other electrode.

19. The method of claim 16 including the step of subjecting the electrodes to an outside magnetic field in order to change polarization of the electrons with respect to the holes through an angle θ.

20. The method of claim 19 wherein the outside magnetic field is in the range of about ±30 Tesla and the electrons and/or the holes are aligned.

21. The method of claim 19 wherein the outside magnetic field is in the range ±30 Tesla and the electrons and the holes are disposed in opposite directions.

22. The device of claim 11 wherein said antiferromagnetic layer is selected from the group consisting of nickel, iron manganese alloys, and mixtures thereof.

23. The method of claim 13 including an antiferromagnetic layer in association with said cathode and/or anode in an external magnetic field.

24. The method of claim 13 including an antiferromagnetic layer on said anode and an external magnetic field.

25. The method of claim 24 wherein said antiferromagnetic layer is selected from the group consisting of nickel, iron manganese alloys, and mixtures thereof.

* * * * *